(12) United States Patent
Nishida

(10) Patent No.: US 7,782,706 B2
(45) Date of Patent: Aug. 24, 2010

(54) SEMICONDUCTOR MEMORY DEVICE HAVING A WORD LINE ACTIVATION CIRCUIT AND/OR A BIT LINE ACTIVATION CIRCUIT AND A REDUNDANT WORD LINE ACTIVATION CIRCUIT AND/OR A REDUNDANT BIT LINE ACITVATION CIRCUIT

(75) Inventor: Yasushi Nishida, Osaka (JP)

(73) Assignee: Panasonic Corporation, Osaka (JP)

( * ) Notice: Subject to any disclaimer, the term of this patent is extended or adjusted under 35 U.S.C. 154(b) by 48 days.

(21) Appl. No.: 12/258,835

(22) Filed: Oct. 27, 2008

(65) Prior Publication Data
US 2009/0122624 A1 May 14, 2009

(30) Foreign Application Priority Data
Nov. 12, 2007 (JP) ............................. 2007-293513

(51) Int. Cl.
*G11C 8/10* (2006.01)
(52) U.S. Cl. ............................. 365/230.08; 365/230.06; 365/200; 365/230.03; 365/156
(58) Field of Classification Search ................. 365/200, 365/230.06, 230.08, 156, 154, 230.03
See application file for complete search history.

(56) References Cited

U.S. PATENT DOCUMENTS

| | | | |
|---|---|---|---|
| 5,583,678 A * | 12/1996 | Nishino et al. ............... 349/118 |
| 6,310,806 B1 | 10/2001 | Higashi et al. | |
| 6,367,030 B1 | 4/2002 | Yamauchi | |
| 6,920,525 B2 | 7/2005 | Chadwick et al. | |
| 7,577,014 B2 * | 8/2009 | Yamagami ................... 365/154 |
| 2002/0019957 A1 | 2/2002 | Higgins et al. | |
| 2002/0157038 A1 | 10/2002 | Callahan | |
| 2004/0237009 A1 | 11/2004 | Tester | |
| 2005/0047225 A1 | 3/2005 | Noguchi | |
| 2007/0038906 A1 | 2/2007 | Lakhani et al. | |
| 2009/0097334 A1 * | 4/2009 | Kurozumi .............. 365/189.12 |

FOREIGN PATENT DOCUMENTS

| JP | 2001-155493 | 6/2001 |
|---|---|---|
| JP | 2005-071413 | 3/2005 |

* cited by examiner

*Primary Examiner*—Andrew Q Tran
(74) *Attorney, Agent, or Firm*—McDermott Will & Emery LLP

(57) ABSTRACT

A word line activation circuit having a temporary memory circuit for storing word line inactivation information for inactivating a word line of a defective memory cell, and an inactivation address sensing circuit for determining whether or not a redundant memory cell is to be used in accordance with the word line inactivation information and an address specification signal is provided for each of word lines. When the inactivation address sensing circuit determines that the redundant memory cell is to be used, a redundant word line is activated by a redundant word line activation circuit.

16 Claims, 9 Drawing Sheets

SEMICONDUCTOR MEMORY DEVICE HAVING A WORD LINE ACTIVATION CIRCUIT AND/OR A BIT LINE ACTIVATION CIRCUIT AND A REDUNDANT WORD LINE ACTIVATION CIRCUIT AND/OR A REDUNDANT BIT LINE ACITVATION CIRCUIT

BACKGROUND OF THE INVENTION

1. Field of the Invention

The present invention relates to a semiconductor memory device having a so-called redundancy repair circuit for repairing a defect in a memory cell.

2. Description of the Prior Art

In recent years, as a data capacity has become larger in the field of digital equipment represented by a high-vision television set, a semiconductor memory has become larger in capacity, and higher in the degree of integration due to the fine design rules thereof. On the other hand, as the memory has thus become larger in capacity, and higher in the degree of integration due to the fine design rules thereof, the probability of the occurrence of defective memory cells has tended to increase. The defective memory cells cause a reduction in chip fabrication yield. Accordingly, it is general practice to provide a semiconductor memory device with a so-called redundancy repair circuit which improves the chip fabrication yield by circuit-wise repairing the defective memory cells causing the reduced chip fabrication yield using preliminarily mounted redundant memory cells.

An example of such a semiconductor memory device is described in, e.g., Japanese Laid-Open Patent Publication No. 2005-71413 (the publication will be hereinafter referred to as Patent Document 1). The semiconductor memory device includes a plurality of memory cell blocks, first fuse blocks, second fuse blocks, a plurality of selection circuits, a plurality of first determination circuits, and a plurality of second determination circuits. Each of the memory cell blocks is composed of memory cells arranged in rows and columns. The first fuse blocks are disposed for the individual memory cell blocks, and each includes a plurality of first fuses corresponding to row address signals on a one-to-one basis. In these first fuses, row replacement addresses are programmed. The second fuse blocks are disposed for the individual memory cell blocks, and each includes a plurality of second fuses corresponding to column address signals on a one-to-one basis. In these second fuses, column replacement addresses are programmed. The selection circuits are connected to the first fuses and the second fuses to output status signals indicative of the status of either the first fuses or the second fuses. The plurality of first determination circuits receive the status signals and the address signals to determine whether or not the status signals match the address signals. The plurality of second determination circuits determine whether or not external addresses specified by the address signals match the row or column replacement addresses based on the outputs of the plurality of first determination circuits.

With the arrangement, the selection circuits output the status signals of the first fuses during the determination of row addresses, and the selection circuits output the status signals of the second fuses during the determination of column addresses. When the replacement of defective memory cells is performed in accordance with the status signals, it becomes possible to circuit-wise repair the defective memory cells using preliminarily mounted redundant memory cells.

Another example of the semiconductor memory device having the redundancy repair circuit is described in Japanese Laid-Open Patent Publication No. 2001-155493 (hereinafter the publication will be hereinafter referred to as Patent Document 2).

The semiconductor memory device includes a redundant memory circuit which stores defective row addresses. After power-on, a line for transmitting row address signals is connected to a spare row decoder circuit in accordance with the defective row address signals preliminarily stored in the redundant memory circuit, and a row decoder circuit replaced with the spare row decoder circuit is inactivated. Therefore, compared with the case where each generated row address signal is compared with defective row address signals stored in a redundant memory circuit, and a spare row decoder or a row decoder is activated in accordance with the result of the comparison, a memory cell can be accessed at a high speed.

The scale of a redundancy repair circuit in a semiconductor memory device has tended to increase for an improved yield. While the degree of integration has become higher due to fine design rules, the occupancy of the redundancy repair circuit has also become higher to cause the probability of preventing a reduction in the size of the semiconductor memory device.

However, in the semiconductor memory device described in Patent Document 1, the first and second determination circuits can be shared among the fuse blocks of the rows and columns. Therefore, compared with the case where different determination circuits are provided individually for the rows and the columns, the area of a circuit for replacement with redundant memory cells can be reduced.

However, the semiconductor memory device described in Patent Document 1 has the problem of a lower access speed because, every time a row address signal is generated, all the bits of the row address signal are compared with those of the defective row address signals stored in the redundant memory circuit, and a redundant row decoder or a row decoder is activated in accordance with the result of the comparison.

On the other hand, the semiconductor memory device described in Patent Document 2 is susceptible to an area reduction because it requires a switching circuit connected to the spare row decoder and to a row address buffer to allow the passage of only defective addresses.

SUMMARY OF THE INVENTION

The present invention has been achieved by focusing attention on the problems mentioned above, and an object thereof is to reduce an area, while improving an access speed.

To solve the problems mentioned above, an embodiment of the present invention is a semiconductor memory device including: a memory cell array including a plurality of memory cells arranged in a matrix composed of rows and columns; a redundant memory cell array including a plurality of redundant memory cells for repairing the memory cell array; a plurality of access control line activation means each connected to either of access control lines which are a word line for controlling an access in a row direction of the memory cell array and a bit line for controlling an access in a column direction thereof; one or more redundant access control line activation means each connected to either of redundant access control lines which are a redundant word line for controlling an access in a row direction of the redundant memory cell array and a redundant bit line for controlling an access in a column direction thereof to activate the redundant access control line connected thereto; and an address decoder for sending out an address specification signal for specifying the access control line activation means corresponding to an address inputted thereto, wherein each of the access control line activation means has a temporary memory circuit for storing access control line inactivation information for inactivating the access control line of a defective memory cell, and an inactivation address sensing circuit for determining whether or not the corresponding one of the redundant memory cells is to be used in accordance with the access control line inactivation information and the address specification signal, and the redundant access control line activation means activates the redundant access control line connected thereto when the inactivation address sensing circuit determines that the redundant memory cell is to be used.

Another embodiment of the present invention is a semiconductor memory device including: a memory cell array including a plurality of memory cells arranged in a matrix comprising rows and columns; a redundant memory cell array including a plurality of redundant memory cells for repairing the memory cell array; a plurality of access control line activation means each connected to both of access control lines which are a word line for controlling an access in a row direction of the memory cell array and a bit line for controlling an access in a column direction thereof; a plurality of redundant access control line activation means one or more of which are connected to both of redundant access control lines which are a redundant word line for controlling an access in a row direction of the redundant memory cell array and a redundant bit line for controlling an access in a column direction thereof to activate the redundant access control lines connected thereto; and an address decoder for sending out an address specification signal for specifying the access control line activation means corresponding to an address inputted thereto, wherein each of the access control line activation means has a temporary memory circuit for storing access control line inactivation information for inactivating the access control line of a defective memory cell, and an inactivation address sensing circuit for determining whether or the corresponding one of the redundant memory cells is to be used in accordance with the access control line inactivation information and the address specification signal, and the redundant access control line activation means activates the redundant access control line connected thereto when the inactivation address sensing circuit determines that the redundant memory cell is to be used.

In these embodiments of the present invention, it is determined whether or not the redundant memory cells are to be used in accordance with the word line inactivation information stored in the temporary memory circuit, and with the address specification signal. Therefore, in accordance with the present invention, it is unnecessary to wait till the establishment of a determination signal indicative of whether or not the redundant memory cells are to be used, unlike in the conventional semiconductor memory device.

DETAILED DESCRIPTION OF THE PREFERRED EMBODIMENTS

Figure 1:
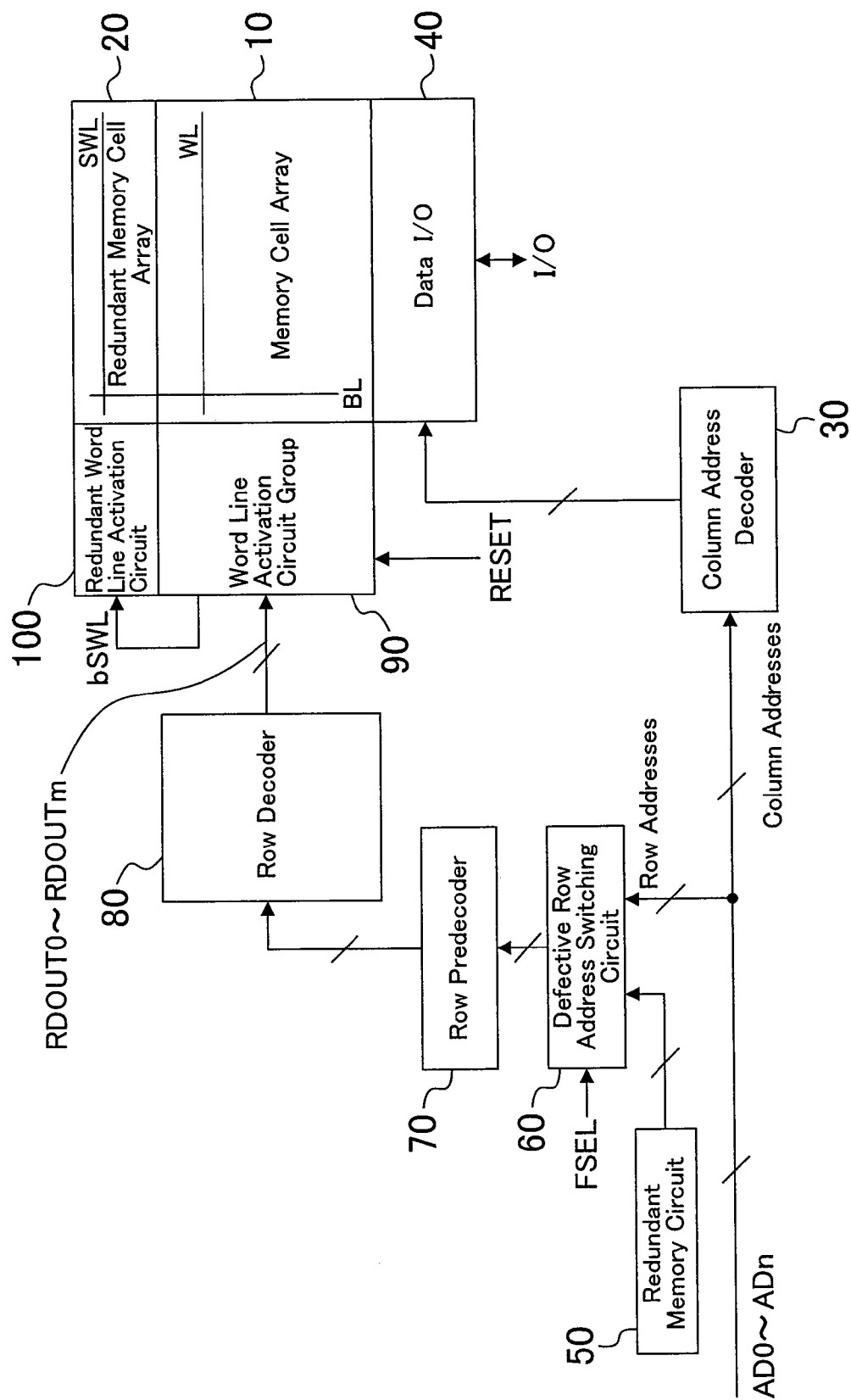
FIG. 1 is a block diagram showing a structure of a semiconductor memory device according to Embodiment 1 of the present invention.

Referring to the drawings, the embodiments of the present invention will be described hereinbelow. In the following description of the individual embodiments, components having the same functions as those of components described once are provided with the same reference numerals, and the description thereof will be omitted.

Embodiment 1

FIG. 1 is a block diagram showing a structure of a semiconductor memory device 1 according to Embodiment 1 of the present invention. As shown in FIG. 1, the semiconductor memory device 1 includes a memory cell array 10, a redundant memory cell array 20, a column address decoder 30, a data I/O 40, a redundant memory circuit 50, a defective row address switching circuit 60, a row predecoder 70, a row decoder 80, a word line activation circuit group 90, and redundant word line activation circuits 100.

—Structure of Each Component—

The memory cell array 10 includes a plurality of memory cells arranged in a matrix composed of rows and columns, and has a plurality of word lines WL arranged in the row direction of the memory cells and a plurality of bit lines BL. That is, the memory cells are disposed at the individual points of intersection of the word lines WL and the bit lines BL.

On the other hand, the redundant memory cell array 20 includes a plurality of redundant memory cells for repairing the memory cells in the memory cell array 10. These redundant memory cells are arranged in a matrix composed of rows and columns. In the row direction of the redundant memory cells, one or more redundant word lines SWL are disposed, while the bit lines BL of the memory cell array 10 are disposed in the column direction thereof. That is, in the redundant memory cell array 20, the redundant memory cells are disposed at the individual points of intersection of the redundant word line or lines SWL and the bit lines BL.

To the semiconductor memory device 1, address signals AD0 to ADn are each inputted to specify a memory cell to be accessed. The inputted address signals AD0 to ADn are branched to row addresses and column addresses to specify the memory cells of the memory cell array 10 with the points of intersection of the rows and the columns. In the following description, it is assumed that the row addresses are AD10 to AD13.

The column address decoder 30 is supplied with a column address to supply a signal obtained by decoding the column address to the data I/O 40.

The data I/O 40 receives the signal outputted from the column address decoder 30 to select any one of the bit lines BL.

The redundant memory circuit 50 stores row address information of defective memory cells in the memory cell array 10.

The defective row address switching circuit 60 is supplied with the row address mentioned above, and connected to the redundant memory circuit 50 to selectively switch between the row address and the row address information of the defective memory cells (which are assumed to be addresses FAD0 to FAD3 in the following description), and pass either the row address or the row address information of the defective memory cells to the row predecoder 70. More specifically, the defective row address switching circuit 60 allows the passage of an input from the redundant memory circuit 50 at power-on and during a reset operation, and allows the passage of the row address during a normal access such that the input or the row address is supplied to the row predecoder 70.

Figure 2:
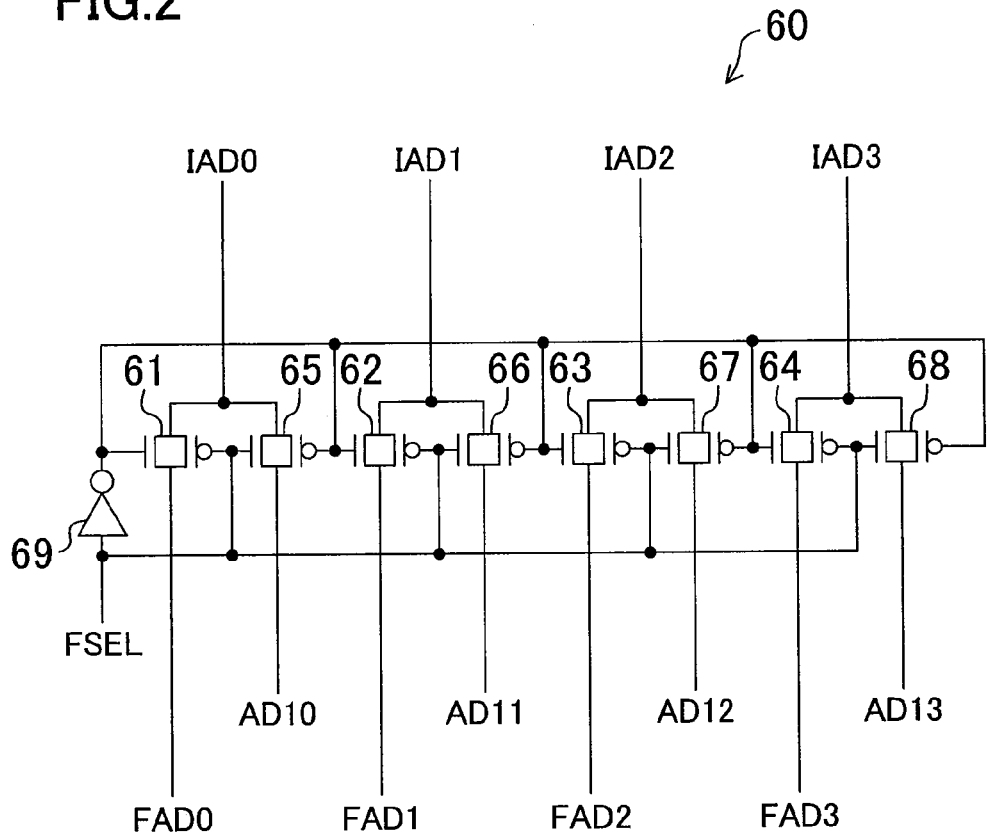
FIG. 2 is a circuit diagram showing an example of a defective row address switching circuit according to Embodiment 1.

FIG. 2 is a circuit diagram showing an example of the defective row address switching circuit 60. As shown in FIG. 2, the defective row address switching circuit 60 includes transfer gates 61 to 68, and an inverter 69. Of these transfer gates, the transfer gates 61 to 64 are respectively connected to the addresses FAD0 to FAD3 supplied from the redundant memory circuit 50, and the transfer gates 65 to 68 are respectively connected to the row addresses AD10 to AD13. To each of the transfer gates, a select signal FSEL and a signal obtained by inverting the select signal FSEL with the inverter 69 are inputted. These signals allow switching between ON/OFF states. By the switching, either the addresses FAD0 to FAD3 or the row addresses AD10 to AD13 are selectively supplied as outputs IAD0 to IAD3 to the row predecoder 70.

The row predecoder 70 is adapted to decode the given row addresses.

The row decoder 80 outputs address specification signals RDOUT0 to RDOUTm obtained by decoding an output of the row predecoder 70 to the word line activation circuit group 90.

The word line activation circuit group 90 includes a plurality of word line activation circuits 91 corresponding to the individual word lines. The word line activation circuit group 90 specifies any one of the word line activation circuits 91 in the word line activation circuit group 90 in accordance with the address specification signals RDOUT0 to RDOUTm outputted from the row decoder 80.

Figure 3:
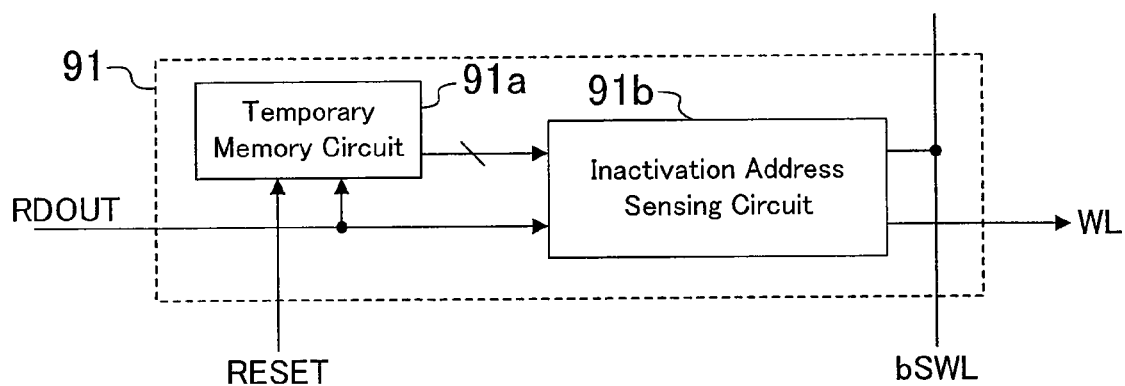
FIG. 3 is a block diagram showing a structure of a word line activation circuit according to Embodiment 1.

FIG. 3 is a block diagram showing a structure of each of the word line activation circuits 91 in the present embodiment. As shown in FIG. 3, the word line activation circuit 91 includes a temporary memory circuit 91a, and an inactivation address sensing circuit 91b. To each of the word line activation circuits 91, any one address specification signal RDOUT among the address specification signals RDOUT0 to RDOUTm which are outputted from the row decoder 80 is inputted. The address specification signal RDOUT is inputted to the temporary memory circuit 91a and to the inactivation address sensing circuit 91b.

The temporary memory circuit 91a stores word line inactivation information used to inactivate the word line of any one of the defective memory cells in the memory cell array 10. The word line inactivation information shows whether or not the row address corresponding to the word line activation circuit 91 is the row address of any of the defective memory cells, and is set in accordance with the row address information of the defective memory cells stored in the redundant memory circuit 50 at power-on and during a reset operation. More specifically, the temporary memory circuit 91a is constructed to store the status of the address specification signal RDOUT at power-on and when a reset signal RESET is inputted during a reset operation. The word line inactivation information mentioned above is given as the address specification signal RDOUT at power-on and during a reset operation.

The inactivation address sensing circuit 91b has the function of a redundant address determination means which determines the use of the redundant memory cell from the word line inactivation information mentioned above and from the address specification signal RDOUT, and the function of inactivating the word line based on the word line inactivation information mentioned above. More specifically, when the row decoder 80 specifies the address of any of the defective memory cells, the inactivation address sensing circuit 91b determines the use of the redundant memory cell, inactivates the word line based on the word line inactivation information mentioned above, and further transmits the necessity to activate the redundant word line SWL to the corresponding redundant word line activation circuit 100 by shifting the potential of a redundancy determination bus bSWL when the address specification signal RDOUT is activated.

The redundant word line activation circuits 100 are provided in correspondence to the individual redundant word lines SWL to activate the corresponding redundant word lines under the control of the word line activation circuits 91. In FIG. 1, only one of the redundant word line activation circuits 100 is depicted as a representative, and the depiction of the other redundant word line activation circuits 100 is omitted.

Figure 4:
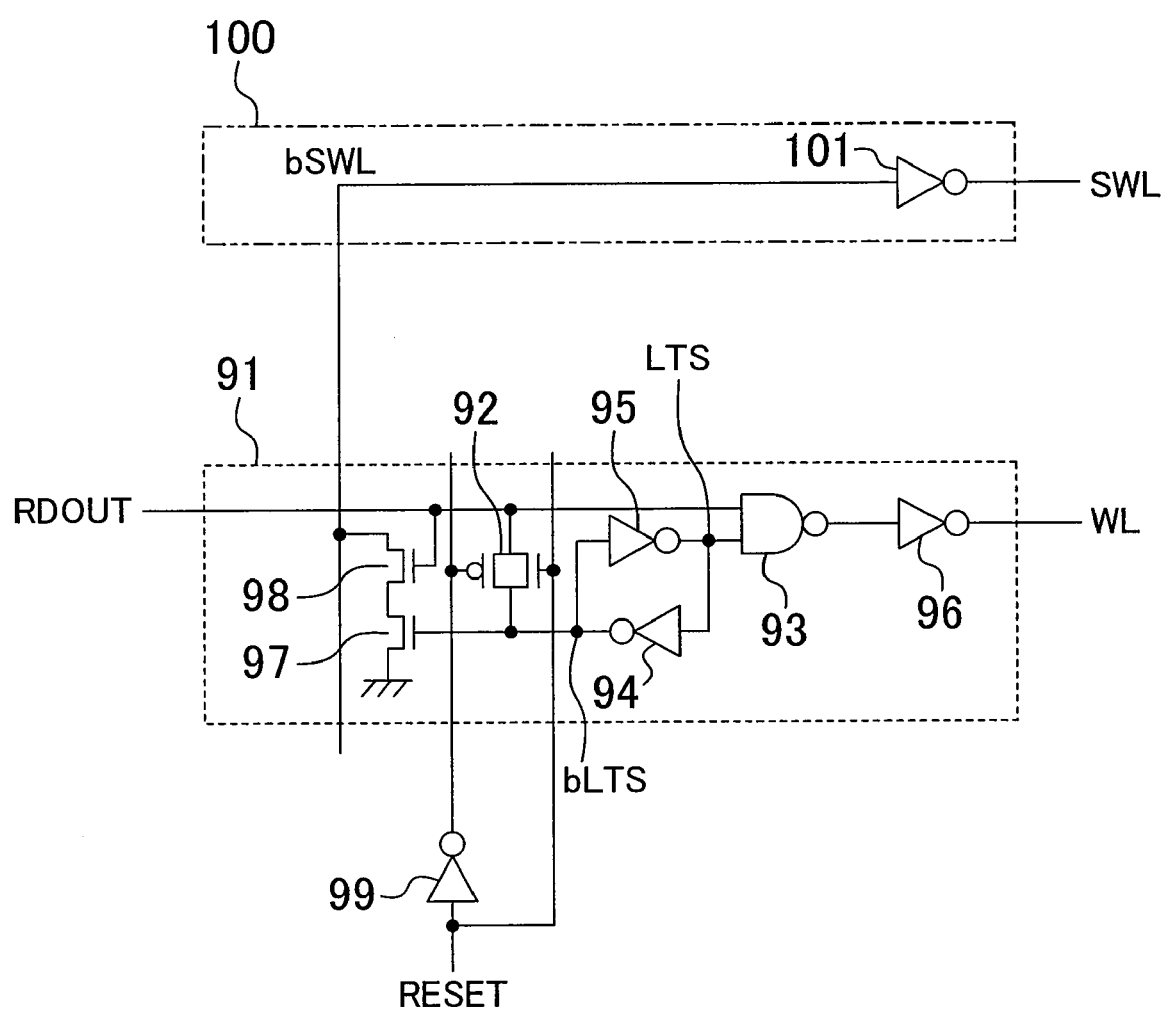
FIG. 4 is a circuit diagram showing an example of a word line activation circuit 91 and a redundant word line activation circuit 100.

FIG. 4 is a circuit diagram showing an example of the word line activation circuit 91 and the redundant word line activation circuit 100. In this example, the word line activation circuit 91 includes a transfer gate 92, a NAND gate 93, inverters 94, 95, and 96, and N-channel transistors 97 and 98. To the transfer gate 92, the reset signal RESET and a signal obtained by inverting the reset signal RESET are inputted. These signals control the ON/OFF states.

The redundant word line activation circuit 100 also includes an inverter 101. In the word line activation circuit 91, a latch composed of the inverters 94 and 95 corresponds to the temporary memory circuit 91a mentioned above.

The word line activation circuit group 90 is preferably disposed between the row decoder 80 and the memory cell array 10, not in the control unit of the memory cell array 10. In particular, when there is a dead space in the vicinity of the row decoder 80, these circuits can be disposed effectively without increasing the area of a memory block.

In the present embodiment, the row decoder 80, the word line activation circuit 91, the redundant word line activation circuit 100, the word line WL, and the redundant word line SWL respectively correspond to an address decoder, an access control line activation means, a redundant access control line activation means, an access control line, and a redundant access control line according to the present invention.

—Operation of Semiconductor Memory Device 1—

(Operation at Power-On)

First, a description will be given to the operation at power-on.

At power-on, the select signal FSEL is given to the defective row address switching circuit 60 to cause the defective row address switching circuit 60 to pass the row address information of the defective memory cells stored in the redundant memory circuit 50 to the row predecoder 70. As a result, the row addresses of the defective memory cells stored in the redundant memory circuit 50 are supplied to the row predecoder 70, and the row predecoder 70 decodes the row addresses and outputs the decoded row addresses to the row decoder 80.

On receiving the output of the row predecoder 70, the row decoder 80 outputs the address specification signals RDOUT0 to RDOUTm corresponding to the row addresses of the defective memory cells. The address specification signals RDOUT0 to RDOUTm outputted from the row decoder 80 are supplied to the individual word line activation circuits 91 in the word line activation circuit group 90. In each of the word line activation circuits 91, the address specification signal RDOUT is supplied to the temporary memory circuit 91a.

When the reset signal RESET is inputted to each of the temporary memory circuits 91a at power-on or during a reset operation, the temporary memory circuit 91a stores the status of the address specification signal RDOUT. As a result, only the temporary memory circuits 91a (i.e., the temporary memory circuits 91a corresponding to the row addresses of the defective memory cells) store information different from that stored in the other temporary memory circuits 91a.

The following is a detailed description of the operation mentioned above, which will be given with reference to FIG. 4.

Figure 5A:
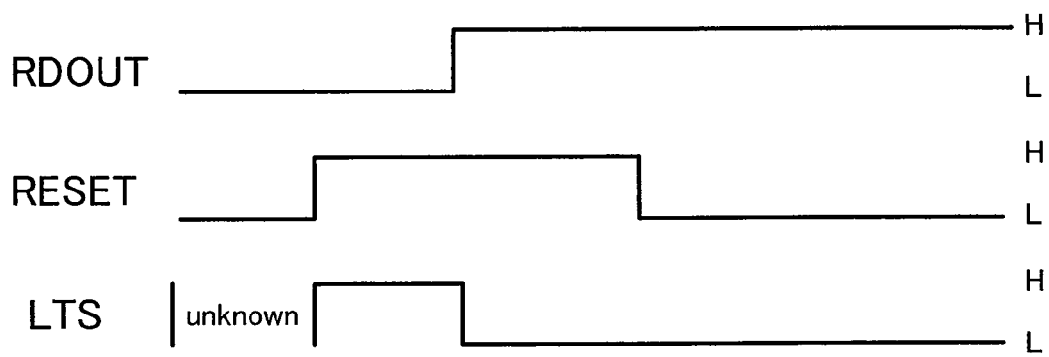
FIG. 5A is a waveform chart showing an operation of the word line activation circuit 91 in a defective memory cell portion at power-on, and FIG. 5B is a waveform chart showing the operation of the word line activation circuit 91 in a portion which is not the defective memory cell portion.
Figure 5B:
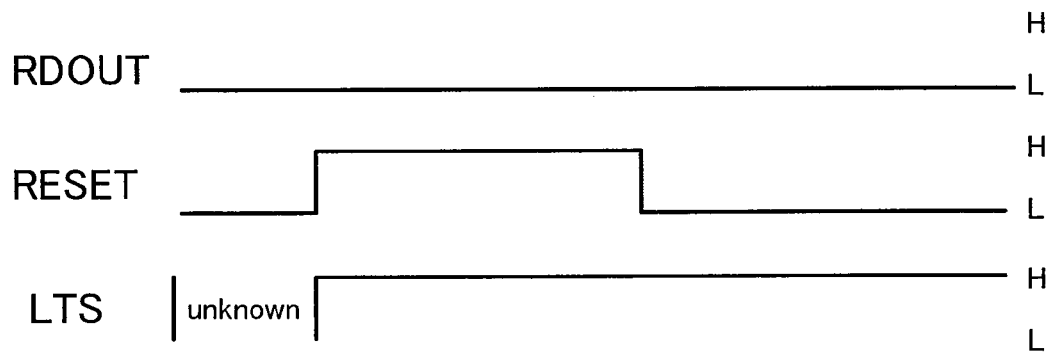

Immediately after power-on, the data stored in the temporary memory circuit 91a made of the latch composed of the inverters 94 and 95 is unstable. At this time, the row decoder 80 outputs the address specification signal RDOUT corresponding to the row address of each of the defective memory cells. FIGS. 5A and 5B show the operation waveforms of these signals at power-on. In the drawing, "unknown" indicates an unstable signal.

FIG. 5A is a waveform chart showing an operation of the word line activation circuit 91 in a defective memory cell portion at power-on. The address specification signal RDOUT is activated to a high potential (H potential) indicative of a defective memory cell in the H potential section of the reset signal RESET. At this time, the transfer gate 92 is in an ON state so that the H potential of the address specification signal RDOUT is inputted to the latch (temporary memory circuit 91a) composed of the inverters 94 and 95. A node LTS (an output of the inverter 95) which is at an unstable potential at power-on is reset to a low potential (L potential) by the inverter 95 upon receipt of the H potential propagated as the address specification signal RDOUT.

On the other hand, FIG. 5B is a waveform chart showing the operation of the word line activation circuit 91 in a portion which is not the defective memory cell portion. The address specification signal RDOUT is at the L potential since the corresponding memory cell is not a defective memory cell. Because the transfer gate 92 is in the ON state in the H potential section of the reset signal RESET, the L potential of the address specification signal RDOUT is inputted to the latch (temporary memory circuit 91a) composed of the inverters 94 and 95. As a result, the node LTS which is at an unstable potential at power-on is set to the H potential.

Thus, at power-on, the temporary memory circuit 91a is set such that the node LTS is at the L potential in the word line activation circuit 91 corresponding to the defective memory cell portion, while the temporary memory circuit 91a is set such that the node LTS is at the H potential in the word line activation circuit 91 corresponding to the portion which is not the defective memory portion.

(Operation During Normal Access)

Next, a description will be given to the operation during a normal access.

During the normal access, the select signal FSEL is given to the defective row address switching circuit 60 to cause the defective row address switching circuit 60 to pass row addresses to the row predecoder 70. As a result, the row addresses are supplied to the row predecoder 70, and the row predecoder 70 decodes the row addresses and outputs the decoded row addresses to the row decoder 80. On receiving the output of the row predecoder 70, the row decoder 80 outputs the address specification signals RDOUT0 to RDOUTm corresponding to the row addresses.

As described above, the temporary memory circuit 91a in each of the word line activation circuits 91 stores the word line activation information indicative of whether or not the row address to which the word line activation circuit 91 corresponds is the row address of any of the defective memory cells.

The inactivation address sensing circuit 91b receives the word line inactivation information stored in the temporary memory circuit 91a and the address specification signal RDOUT outputted from the row decoder 80. When the word line inactivation information indicates the row address of any of the defective memory cells, the inactivation address sensing circuit 91b inactivates the corresponding word line WL, and further shifts the potential of the redundancy determination bus bSWL upon the activation of the address specification signal RDOUT to transmit the necessity to activate the redundant word line SWL to the redundant word line activation circuit 100. On the other hand, when the word line inactivation information does not indicate the row address of any of the defective memory cells, the inactivation address sensing circuit 91b activates the word line WL of the memory cell array 10 to select it upon the activation of the address specification signal RDOUT.

The following is a detailed description of the operation mentioned above, which will be given with reference to FIG. 4.

The row addresses AD10 to AD13 are supplied to the row predecoder 70 through the defective row address switching circuit 60. On receiving the output of the row predecoder 70, the row decoder 80 outputs the address specification signals RDOUT0 to RDOUTm corresponding to the row addresses.

When the address specified by the row decoder 80 corresponds to a defective memory portion, the node LTS is at the L potential, as described above. Accordingly, the output of the NAND gate 93 is at the H potential so that the word line WL is at the L potential. As a result, the word line of the memory cell is inactivated. Conversely, when the specified address is not a defective address, the node LTS is at the H potential. As a result, the word line WL is activated by the passage of the address specification signal RDOUT through the NAND gate 93 and the inverter 96.

Next, a description will be given to the transition of the potential of the redundancy determination bus bSWL.

Figure 6A:
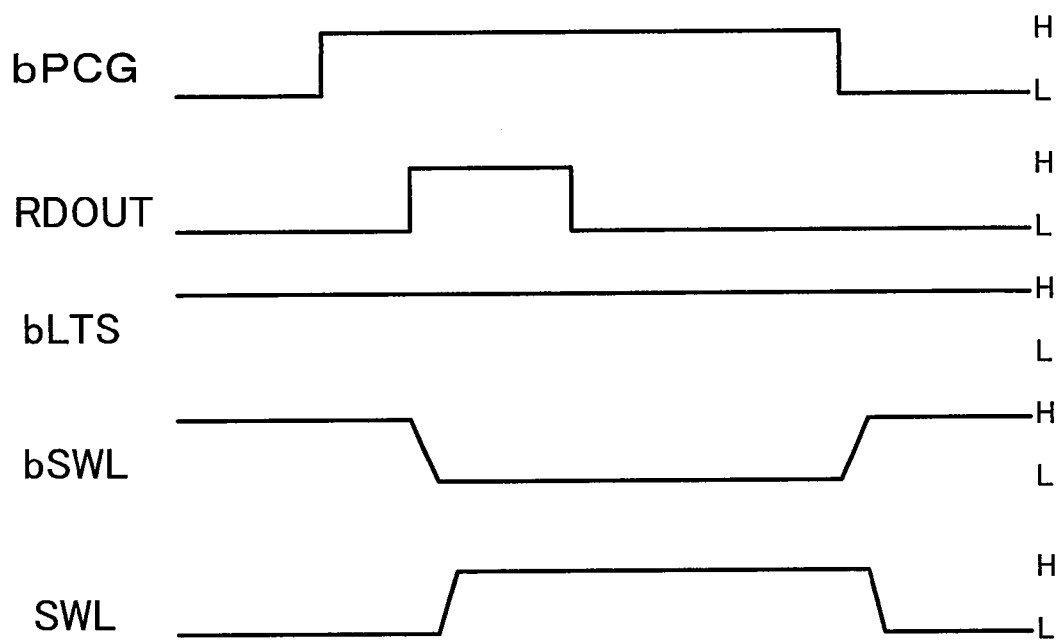
FIG. 6A is an operation waveform chart of the word line activation circuit 91 in the defective memory cell portion during the normal operation.
Figure 6B:
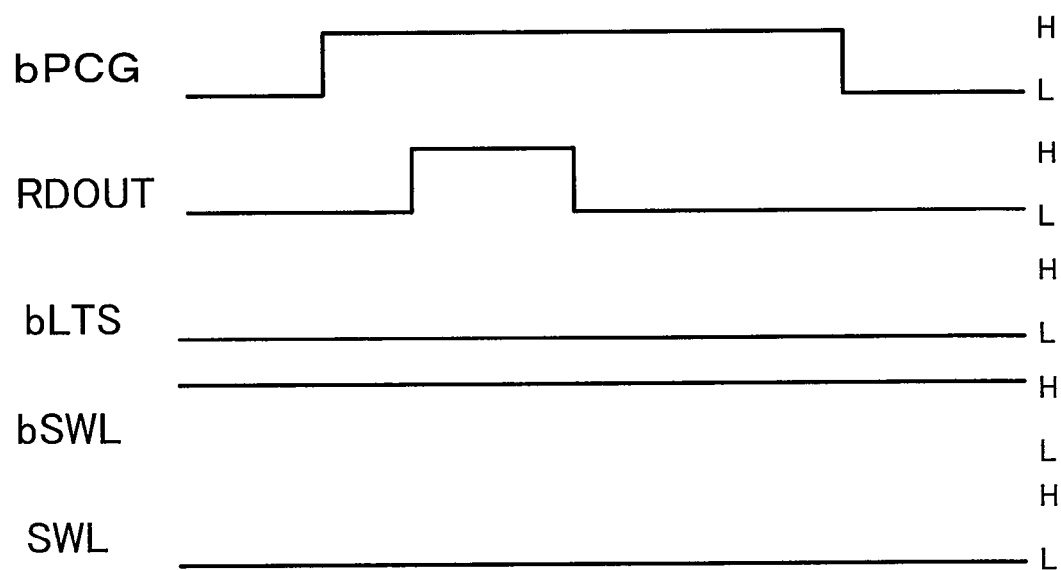
FIG. 6B is an operation waveform chart of the word line activation circuit 91 in the portion which is not the defective memory cell portion during the normal operation.

FIG. 6A is an operation waveform chart of the word line activation circuit 91 in the defective memory cell portion during the normal operation. FIG. 6B is an operation waveform chart of the word line activation circuit 91 in the portion which is not the defective memory cell portion during the normal operation.

Figure 7:
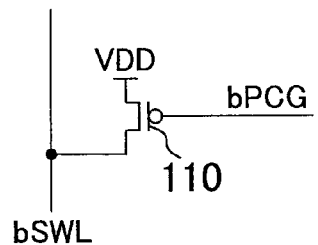
FIG. 7 is a view showing an example of a control circuit for a redundancy determination bus bSWL.

The redundancy determination bus bSWL is composed of a P-channel transistor 110 controlled by, e.g., a signal bPCG shown in the circuit diagram of FIG. 7. The redundancy determination bus bSWL is precharged in advance to the H potential, and the precharge is turned OFF in a period including the H potential section of the address specification signal RDOUT from the row decoder 80.

In the word line activation circuit 91 corresponding to the defective memory cell portion, the node LTS is at the L potential, and a node bLTS (an output of the inverter 94) is at the H potential, as shown in FIG. 6A. Accordingly, the N-channel transistor 97 is in the ON state. When the N-channel transistor 98 which has received the address specification signal RDOUT at the gate thereof is turned ON on receiving the H potential of the address specification signal RDOUT, the potential of the redundancy determination bus bSWL shifts to the L potential.

By using the circuit in which the N-channel transistor 97 and the N-channel transistor 98 are thus arranged in series, the redundancy determination bus bSWL can be controlled with a small number of elements.

In the word line activation circuit 91 corresponding to the portion which is not the defective memory cell, the node LTS is at the H potential, and the node bLTS is at the L potential, as shown in FIG. 6B. Accordingly, the N-channel transistor 97 is in the OFF state. At this time, since the potential of the redundancy determination bus bSWL that has been set to the H potential in advance does not shift to the L potential irrespective of the potential of the address specification signal RDOUT, the redundancy determination bus bSWL retains the H potential.

As a result, when the address specification signal RDOUT for the defective memory cell portion is activated to the H potential, the redundancy determination bus bSWL is set to the L potential. Then, the redundant word line SWL connected to the output of the inverter 101 is set to the H potential, and the redundant word line SWL of the redundant memory cell of the redundant memory cell array 20 is activated.

Thus, according to the present embodiment, the row decoder 80 need not wait till the establishment of a determination signal indicative of whether or not a redundant memory cell is to be used, unlike in the conventional semiconductor memory device, and an exclusive OR circuit is not required, unlike in the conventional address determination circuit. Therefore, the access speed can be improved.

Since the exclusive OR circuit used in the address determination circuit of Patent Document 1 and a switching circuit which allows the passage of only defective addresses of Patent Document 2 are not necessary, the effect of an area reduction is achieved. Although the present embodiment involves the addition of the temporary memory circuit 91a and the word line activation circuit group 90, when there is a dead space in the vicinity of the row decoder 80, these circuits can be placed without increasing the area of a memory block.

Although the select signal FSEL and the reset signal RESET are provided as different and distinct signals in the present embodiment, it is also possible to generate the reset signal RESET from the select signal FSEL.

Embodiment 2

Figure 8:
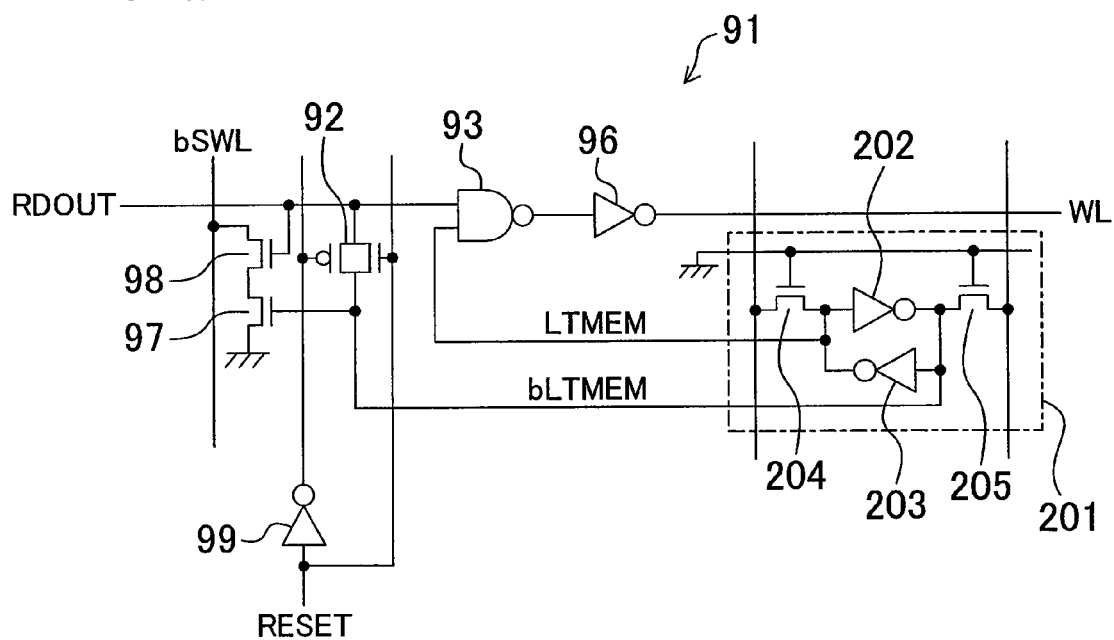
FIG. 8 is a circuit diagram of a word line activation circuit in a semiconductor memory device according to Embodiment 2 of the present invention.

A semiconductor memory device of Embodiment 2 of the present invention is different from that of Embodiment 1 in the structure of the word line activation circuit 91. FIG. 8 is a circuit diagram of the word line activation circuit 91 of the semiconductor memory device of Embodiment 2.

The memory cell array 10 adjacent to each of the word line activation circuits 91 is composed of memory cells operating as a memory device. Therefore, the present embodiment uses the memory function of the memory cells in the memory cell array 10 as a replacement for the temporary memory circuit 91a.

Figure 9:
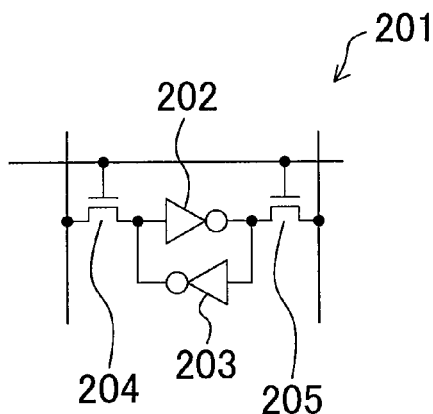
FIG. 9 is a view showing an example of a structure of a memory cell.

The circuit enclosed by the dash-dot line of FIG. 8 is a SRAM memory cell (memory cell 201) in the memory cell array 10. FIG. 9 is a view showing only the memory cell 201 extracted from the memory cell array 10. As shown in FIG. 9, the memory cell 201 has a latch composed of inverters 202 and 203, and N-channel transistors 204 and 205. In the memory cell 201, the N-channel transistors 204 and 205 are each turned OFF by fixing each of the gates thereof to a ground potential.

The memory cell array 10 has a layout in a repetitive pattern configuration to occupy a reduced area. Therefore, by composing a temporary memory circuit of a memory circuit using the layout of the memory cells, an area reduction can be achieved.

Thus, according to the present embodiment, it is unnecessary to provide the latch composed of the inverters 94 and 95 as the temporary memory circuit, unlike in Embodiment 1. Accordingly, an area reduction can be achieved.

As the memory cells each used herein as the temporary memory circuit, there may also be used memory cells each having a size larger than in the layout of typically used memory cells for the purpose of stabilization.

Embodiment 3

Figure 10:
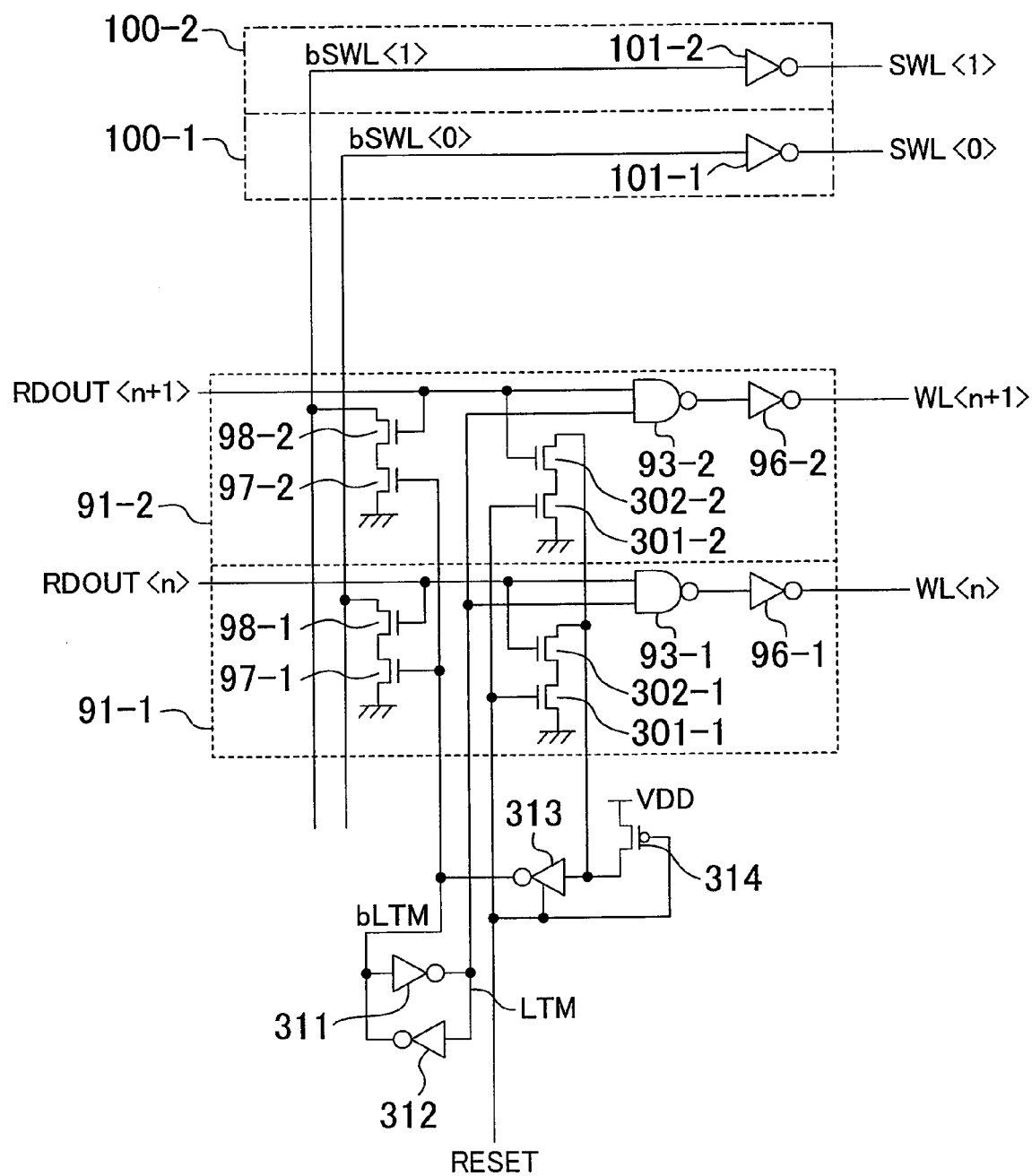
FIG. 10 is a circuit diagram of a word line activation circuit and a redundant word line activation circuit in a semiconductor memory device according to Embodiment 3 of the present invention.

A semiconductor memory device according to Embodiment 3 of the present invention is different from that of Embodiment 1 in the structures of the word line activation circuit and the redundant word line activation circuit. FIG. 10 is a circuit diagram of the word line activation circuit 91 and the redundant word line activation circuit 100 of the semiconductor memory device according to Embodiment 3.

In the semiconductor memory device of Embodiment 1, the temporary memory circuits 91a and the word lines of the memory cells are in a one-to-one correspondence. Therefore, to prevent the disturbance of the repetition pitch of the layout, each of the temporary memory circuits 91a is required to be laid out with a width not more than the width of each of the memory cells. For this purpose, the present embodiment has achieved an area reduction by providing a plurality of word lines with a single temporary memory circuit.

For simplicity of explanation, a description will be given hereinbelow to an example having two word lines WL<n> and WL<n+1>, and two redundant word lines SWL<0> and SWL<1>. The numbers of the word lines and the redundant word lines are only illustrative, and the present invention is also applicable to the case where each of the numbers of the word lines and the redundant word lines is not less than three.

In this example also, the word line activation circuit 91 is provided for each of the word lines, and the redundant word line activation circuit 100 is provided in correspondence to each of the redundant word lines SWL. For the discrimination between these word line activation circuits 91 and the redundant word line activation circuits 100, a branch number is added subsequently to each of the reference numerals 91 and 100 in the drawing or the like. In FIG. 10, the word line activation circuit 91-1 activates the word line WL<n>, and the word line activation circuit 91-2 activates the word line WL<n+1>. On the other hand, the redundant word line activation circuit 100-1 activates the redundant word line SWL<0>, and the redundant word line activation circuit 100-2 activates the redundant word line SWL<1>.

In this example, each of the word line activation circuits 91 includes N-channel transistors 97, 98, 301, and 302, a NAND gate 93, and an inverter 96, while the N-channel transistors 301 and 302 are disposed in series. These components are also provided with the same additional branch numbers as added to the individual word line activation circuits 91 for the discrimination between those intended for the word line WL<n> and those intended for the word line WL<n+1>.

In the present embodiment, the two word line activation circuits 91-1 and 91-2 share the single temporary memory circuit 91a. The temporary memory circuit 91a of the present embodiment includes inverters 311 and 312 composing a latch, a tri-state inverter 313, and a P-channel transistor 314.

—Operation of Semiconductor Memory Device in Embodiment 3—

(Operation at Power-On)

First, a description will be given to the operation at power-on.

When there is a defective memory cell in the word line WL<n+1>, the row decoder 80 supplies the H potential indicative of the defective memory cell as an address specification signal RDOUT<n+1>, and the L potential as an address specification signal RDOUT<n>.

By setting the reset signal RESET to the H potential herein, the P-channel transistor 314 is turned OFF, and the N-channel transistor 301-1 and the N-channel transistor 301-2 are each turned ON. On receiving the H potential of the RDOUT<n+1>, the N-channel transistor 302-2 is turned ON to shift the input of the tri-state inverter 313 to the L potential. As a result, the output bLTM (an output of the inverter 312) of the latch composed of the inverters 311 and 312 shifts to the H potential, and the output LTM (an output of the inverter 311) shifts to the L potential. That is, when a defective memory address is included in the memory cells connected to the word line WL<n> and the word line WL<n+1>, the output LTM is set to the L potential. On the other hand, when a defective memory address is not included therein, the output LTM is set to the H potential.

(Normal Operation)

Next, a description will be given to the normal operation.

As described above, when the defective memory address is included, the output LTM shifts to the L potential, while the output LTM is set to the H potential when the defective memory address is not included. When the output LTM is at the L potential, each of the NAND gates 93-1 and 93-2 outputs the H potential, so that each of the word lines WL<n> and WL<n+1> shifts to the L potential to be inactivated. On the other hand, when the defective address is included, the N-channel transistor 97-2 is in the ON state since the H-potential has been supplied to the gate thereof. When the address specification signal RDOUT<n+1> is activated to the H potential, the N-channel transistor 98-2 is turned ON on receiving the H potential of the address specification signal RDOUT to shift the potential of the redundancy determination bus bSWL<1> to the L potential. As a result, the redundant word line SWL<1> is set to the H potential to be activated.

Likewise, when the address specification signal RDOU<n> is activated to the H potential, the redundant word line SWL<0> shifts to the H potential to be activated. That is, an operation of replacing the word line WL<n> with the redundant word line SWL<0>, and replacing the word line WL<n+1> with the redundant word line SWL<1> is performed.

Embodiment 4

Figure 11:
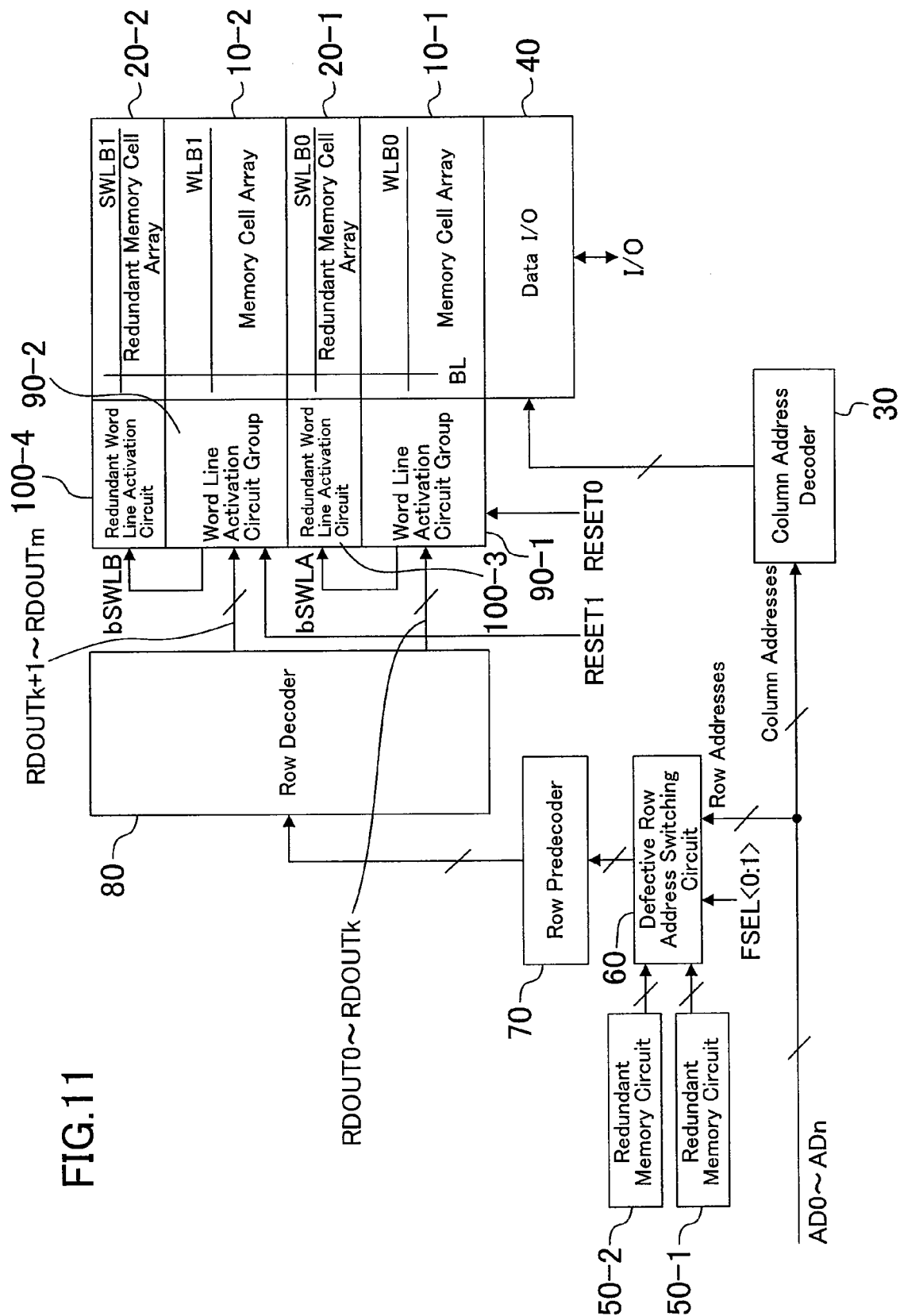
FIG. 11 is a block diagram showing a structure of a semiconductor memory device according to Embodiment 4 of the present invention.

FIG. 11 is a block diagram showing a structure of a semiconductor memory device according to Embodiment 4 of the present invention. In Embodiment 1, the semiconductor memory device includes one set of the memory cell array 10, the redundant memory cell array 20 for repairing the memory cell array 10, and the redundant memory circuit 50 for storing the defective information thereof. By contrast, the semiconductor memory device of the present embodiment includes a plurality of the memory cell arrays 10, and a plurality of the redundant memory cell arrays 20 for repairing the memory cell arrays 10. A description will be given hereinbelow to the case where, as shown in FIG. 11, each of the numbers of the memory cell arrays 10 and the redundant memory cell arrays 20 is two for simplicity of explanation. In the drawing and the like, a branch number is added subsequently to each of the reference numerals of components each provided in plurality for the discrimination thereof.

In the structure, the word line activation circuit group 90 and the redundant word line activation circuit 100 are also each provided in plurality in correspondence to each of the memory cell arrays 10 and the redundant memory cell arrays 20. The redundant memory circuit 50-1 stores the row address information of defective memory cells in the memory cell array 10-1, and the redundant memory circuit 50-2 stores the row address information of defective memory cells in the memory cell array 10-2. To the word line activation circuit groups 90-1 and 90-2, reset signals RESET0 and RESET1 different from each other are inputted.

The defective row address switching circuit 60 is controlled by the select signal FSEL<0:1> to switch between the defective address information of the memory cell array 10-1 stored in the redundant memory circuit 50-1 and the defective address information of the memory cell array 10-2 stored in the redundant memory circuit 50-2, and supplies the defective addresses to the row predecoder 70. By selectively resetting the word line activation circuit groups 90-1 and 90-2 using the reset signal RESET0 for the word line activation circuit group 90-1 and the reset signal RESET1 for the word line activation circuit group 90-2, the defective address information is set to the temporary memory circuit 91a present in the word line activation circuit 91 within the individual word line activation circuit group 90.

According to the present embodiment constituted as described above, it is possible to repair a plurality of defects in the plurality of memory cell arrays. When the plurality of defects are thus repaired, the conventional circuit requires a plurality of the exclusive OR circuits each used as the address determination circuit and a plurality of the switching circuits, as described above. By contrast, the present embodiment does not require these circuits. This achieves the effect of suppressing an area increase.

It is to be noted that the number of the memory cell arrays 10, the number of the redundant memory cell arrays 20, and the like described in the present embodiment are only illustrative. The present embodiment is also applicable to the case where the number of the memory cell arrays 10, the number of the redundant memory cell arrays 20, and the like are each not less than three.

Embodiment 5

Figure 12:
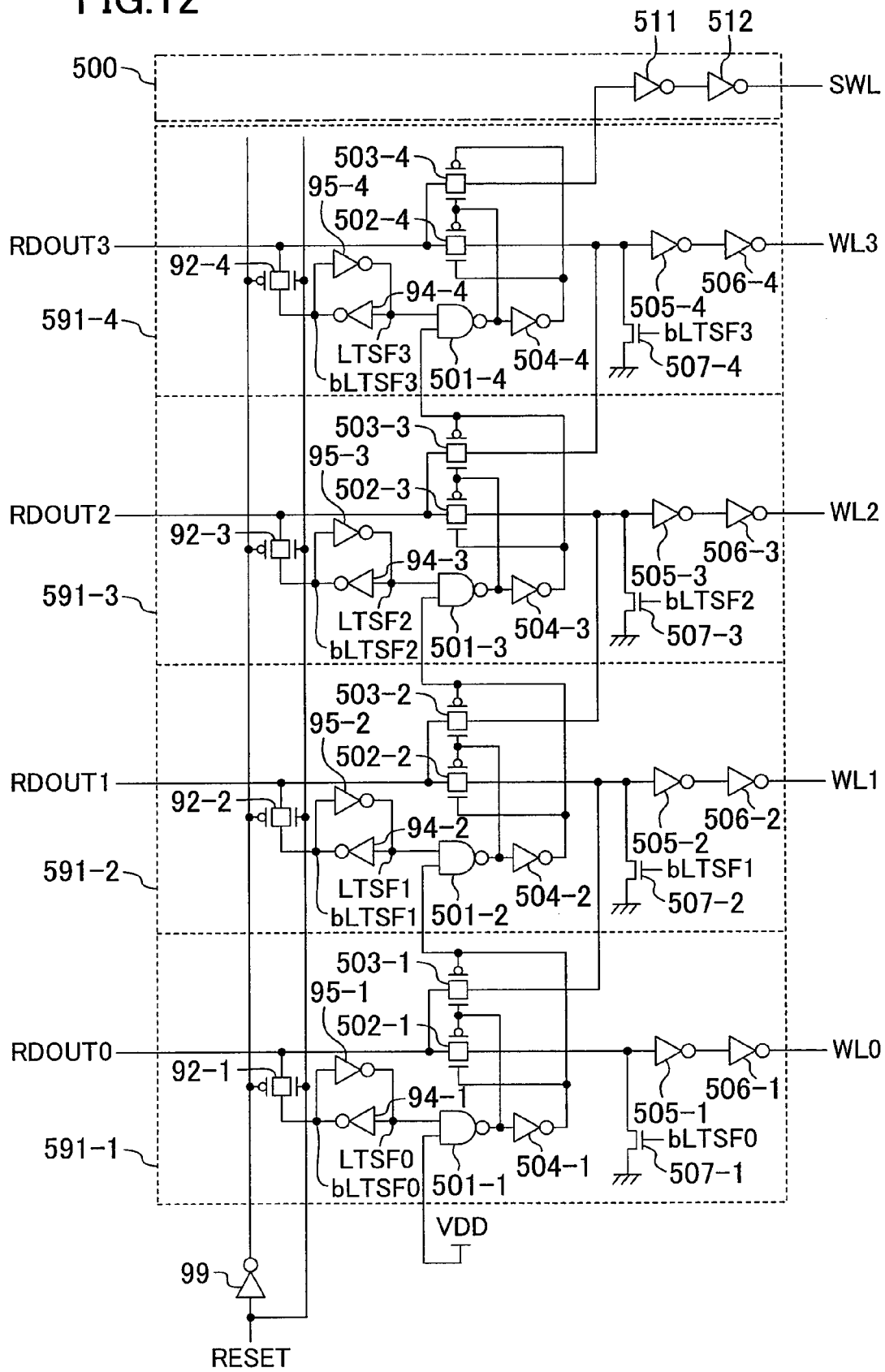
FIG. 12 is a circuit diagram of a word line activation circuit and a redundant word line activation circuit in a semiconductor memory device according to Embodiment 5 of the present invention.

FIG. 12 is a circuit diagram of a word line activation circuit and a redundant word line activation circuit according to Embodiment 5 of the present invention. In this example, the four word lines WL0 to WL3, four word line activation circuits 591-1 to 591-4, and a redundant word line activation circuit 500 as the redundant word line activation circuit are provided.

In the semiconductor memory device of Embodiment 1, when a defective memory address is indicated, the redundant memory cell in the redundant memory cell array 20 disposed separately from the memory cell array 10 is accessed. By contrast, when a defective memory address is indicated in the present embodiment, the address specification signal from the row decoder is shift-transferred to an address adjacent to the defective memory address to access a memory cell at the adjacent address.

As shown in FIG. 12, the individual word line activation circuit 591 of the present embodiment includes a transfer gate 92, inverters 94 and 95, a NAND gate 501, transfer gates 502 and 503, inverters 504, 505, and 506, and an N-channel transistor 507.

In this example also, the latch is composed of the inverters 94 and 95. One input to the NAND gate 501-1 is fixed to a VDD potential, i.e., the H potential. The N-channel transistor 507 is a transistor which is fixed to the L potential when the word line is not used. The N-channel transistor 507 is turned ON when the output bLTSF thereof is at the H potential to set an input to the inverter 505 to the L potential. When the input of the inverter 505 is set to the L potential, the word line WL is fixed to the L potential because the inverter 506 is connected in series to the inverter 505.

The word line activation circuit 500 of the present embodiment also includes inverters 511 and 512 connected in series.

—Operation of Semiconductor Memory Device of Embodiment 5—

A description will be given hereinbelow to an operation in the present embodiment with reference to FIG. 12. The description will be given hereinbelow to an exemplary case where the word line WL2 is the word line of any of the defective memory cells.

(Operation at Power-On)

First, a description will be given to the operation at power-on.

When the reset signal RESET is set to the H potential, the transfer gate 92 in each of the word line activation circuits 591 is turned ON. As a result, the potential of the address specification signal RDOUT2 corresponding to a defective address at the output bLTSF2 (an output of the inverter 94-3) of the latch is set to the H potential, and the output LTSF2 (an output of the inverter 95-3) is set to the L potential. The potentials of the address specification signals RDOUT0, RDOUT1, and RDOUT3 corresponding to addresses which are not defective addresses at the outputs LTSF0, LTSF1, and LTSF3 of the latches of the word line activation circuits 591 are each set to the H potential.

(Normal Operation)

Next, a description will be given to a normal operation.

Since the output LTSF0 (an output of the inverter 95-1) is set to the H potential, the NAND gate 501-1 outputs the L potential. The transfer gate 502-1 is in the ON state, and the transfer gate 503-1 is in the OFF state. In addition, since the output LTSF1 (an output of the inverter 95-2) is also set to the H potential, the NAND gate 501-2 outputs the L potential. As a result, the transfer gate 502-2 is in the ON state, and the transfer gate 503-2 is in the OFF state.

As described above, since the output LTSF2 is set to the L potential indicative of the defective address, the NAND gate 501-3 outputs the H potential so that the transfer gate 502-3 is in the OFF state, and the transfer gate 503-3 is in the ON state. That is, the signal inputted as the address specification signal RDOUT2 is shift-transferred to be supplied to the inverter 505-4 through the transfer gate 503-3, and propagate to the word line WL3.

On the other hand, the inverter 504-3 receives the H-potential output of the NAND gate 501-3, and outputs the L potential. Accordingly, the NAND gate 501-4 outputs the H potential. As a result, the transfer gate 502-4 is turned OFF, and the transfer gate 503-4 is turned ON. Consequently, the address specification signal RDOUT3 is supplied to the inverter 511 through the transfer gate 503-4, and further propagates to the redundant word line SWL via the inverter 512. That is, the address specification signal RDOUT0 propagates to the word line WL0, the address specification signal RDOUT1 propagates to the word line WL1, the address specification signal RDOUT2 is shift-transferred to the word line WL3, and the address specification signal RDOUT3 propagates to the redundant word line SWL. The N-channel transistors 507-1 to 507-4 are for fixing the word lines, which are not in use, to the L potential. In this example, since the output bLTSF2 is at the H potential, the N-channel transistor 507-3 is in the ON state so that the input of the inverter 505-3 is set to the L potential, and consequently the word line WL2 is set to the L potential.

Thus, the present embodiment allows physical memory addresses after redundancy repair to be arranged consecutively. This achieves the effect of enabling an operation verification test after fabrication, which is an operation test including the influence of an adjacent memory cell, to be performed by the same address specification as performed in the case where redundancy repair is not performed.

Although the present embodiment has described the example in which the four word lines are provided for simplicity of explanation, the present embodiment is also applicable to the case where the number of the word line activation circuits is not less than five.

Other Embodiments

It is to be noted that the present invention pertains to memory address selection in the semiconductor memory device, which is a technology applicable to, e.g., a dynamic random access memory (DRAM), a static random access memory (SRAM), or the like, and the type of the memory is not particularly limited.

Although each of the embodiments described above shows an example of redundancy repair performed with respect to the word line at the row address, the present invention is not limited thereto. It is also possible to perform redundancy repair with respect to the bit line at the column address, and perform redundancy repair with respect to each of the word line and the bit line by applying the present invention.

Although each of the embodiments described above has used the latch as the temporary memory circuit, the temporary memory circuit is not limited thereto. It is also possible to replace the latch with a memory operating as a temporary memory circuit such as a volatile memory represented by a flip-flop, or a non-volatile memory represented by a flash memory.

Because it is sufficient for the redundant memory circuit of each of the embodiments described above to have the function of indicating a defective address, the redundant memory circuit may also be a dc potential applied from the outside, or a dc potential generated in the inside.

Although each of the embodiments has been constituted using MOS transistors, the constituents need not necessarily be the MOS transistors. Any switchable elements may be used appropriately as the constituents of each of the embodiments described above.

It will be understood that present invention is not limited to the embodiments described above, and various changes and modifications can be made in the invention within the scope in which the gist of the present invention is not changed.

Thus, the semiconductor memory device according to the present invention has the effect of allowing an area reduction, while improving an access speed, and is therefore useful as a semiconductor memory device having a so-called redundancy repair circuit which repairs a defect in a memory cell or the like.

The invention claimed is:

1. A semiconductor memory device comprising:
a memory cell array including a plurality of memory cells arranged in a matrix composed of rows and columns;
a redundant memory cell array including a plurality of redundant memory cells for repairing the memory cell array;
a plurality of access control line activation means each connected to either of access control lines which are a word line for controlling an access in a row direction of the memory cell array and a bit line for controlling an access in a column direction thereof;
one or more redundant access control line activation means each connected to either of redundant access control lines which are a redundant word line for controlling an access in a row direction of the redundant memory cell array and a redundant bit line for controlling an access in a column direction thereof to activate the redundant access control line connected thereto; and
an address decoder for sending out an address specification signal for specifying the access control line activation means corresponding to an address inputted thereto, wherein
each of the access control line activation means has a temporary memory circuit for storing access control line inactivation information for inactivating the access control line of a defective memory cell, and an inactivation address sensing circuit for determining whether or not the corresponding one of the redundant memory cells is to be used in accordance with the access control line inactivation information and the address specification signal, and
the redundant access control line activation means activates the redundant access control line connected thereto when the inactivation address sensing circuit determines that the redundant memory cell is to be used.

2. The semiconductor memory device of claim 1, wherein the temporary memory circuit is set by the address specification signal which is sent out by inputting an address of the defective memory cell to the address decoder.

3. The semiconductor memory device of claim 1, wherein the temporary memory circuit is a latch circuit.

4. The semiconductor memory device of claim 1, wherein the inactivation address sensing circuit comprises two or more transistors which are disposed in series and receive the access control line inactivation information and the address specification signal at respective gates thereof.

5. The semiconductor memory device of claim 1, wherein the temporary memory circuit is constructed using the memory cell in the memory cell array.

6. The semiconductor memory device of claim 1, wherein the redundant access control line includes two or more redundant access control lines, and the number of the redundant access control line activation means which are provided corresponds to the number of the redundant access control lines.

7. The semiconductor memory device of claim 1, wherein
a plurality of the memory cell arrays are provided, and
a plurality of the access control line activation means and a plurality of the redundant access control line activation means are provided in correspondence to the individual memory arrays on a one-to-one basis.

8. The semiconductor memory device of claim 1, wherein each of the access control line activation means has means for shift-transferring the address specification signal from the address decoder to an adjacent address.

9. A semiconductor memory device comprising:
a memory cell array including a plurality of memory cells arranged in a matrix composed of rows and columns;
a redundant memory cell array including a plurality of redundant memory cells for repairing the memory cell array;
a plurality of access control line activation means each connected to both of access control lines which are a word line for controlling an access in a row direction of the memory cell array and a bit line for controlling an access in a column direction thereof;
a plurality of redundant access control line activation means one or more of which are connected to both of redundant access control lines which are a redundant word line for controlling an access in a row direction of the redundant memory cell array and a redundant bit line for controlling an access in a column direction thereof to activate the redundant access control lines connected thereto; and
an address decoder for sending out an address specification signal for specifying the access control line activation means corresponding to an address inputted thereto, wherein
each of the access control line activation means has a temporary memory circuit for storing access control line inactivation information for inactivating the access control line of a defective memory cell, and an inactivation address sensing circuit for determining whether or the corresponding one of the redundant memory cells is to be used in accordance with the access control line inactivation information and the address specification signal, and
the redundant access control line activation means activates the redundant access control line connected thereto when the inactivation address sensing circuit determines that the redundant memory cell is to be used.

10. The semiconductor memory device of claim 9, wherein the temporary memory circuit is set by the address specification signal which is sent out by inputting an address of the defective memory cell to the address decoder.

11. The semiconductor memory device of claim 9, wherein the temporary memory circuit is a latch circuit.

12. The semiconductor memory device of claim 9, wherein the inactivation address sensing circuit comprises two or more transistors which are disposed in series and receive the access control line inactivation information and the address specification signal at respective gates thereof.

13. The semiconductor memory device of claim 9, wherein the temporary memory circuit is constructed using the memory cell in the memory cell array.

14. The semiconductor memory device of claim 9, wherein the redundant access control line includes two or more redundant access control lines, and the number of the redundant access control line activation means which are provided corresponds to the number of the redundant access control lines.

15. The semiconductor memory device of claim 9, wherein
a plurality of the memory cell arrays are provided, and
a plurality of the access control line activation means and a plurality of the redundant access control line activation means are provided in correspondence to the individual memory arrays on a one-to-one basis.

16. The semiconductor memory device of claim 9, wherein each of the access control line activation means has means for shift-transferring the address specification signal from the address decoder to an adjacent address.

* * * * *